(12) United States Patent
Shirota et al.

(10) Patent No.: US 6,977,409 B2
(45) Date of Patent: Dec. 20, 2005

(54) FLASH MEMORY HAVING MEMORY SECTION AND PERIPHERAL CIRCUIT SECTION

(75) Inventors: Riichiro Shirota, Fujisawa (JP); Kikuko Sugimae, Yokohama (JP); Masayuki Ichige, Yokohama (JP); Atsuhiro Sato, Zushi (JP); Hiroaki Hazama, Hachioji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/685,599

(22) Filed: Oct. 16, 2003

(65) Prior Publication Data

US 2004/0081002 A1    Apr. 29, 2004

Related U.S. Application Data

(62) Division of application No. 09/899,155, filed on Jul. 6, 2001, now Pat. No. 6,667,507.

(30) Foreign Application Priority Data

Sep. 29, 2000    (JP) .............................. 2000-301308

(51) Int. Cl.[7] .......................................... H01L 29/788
(52) U.S. Cl. ...................... 257/316; 257/317; 257/319; 257/320; 257/321
(58) Field of Search ............................... 257/315–317, 257/319–321

(56) References Cited

U.S. PATENT DOCUMENTS

| 4,897,815 | A | 1/1990 | Tanaka et al. |
| 6,011,293 | A | 1/2000 | Yuzuriha et al. |
| 6,228,713 | B1 | 5/2001 | Pradeep et al. |
| 6,228,714 | B1 | 5/2001 | Choi |
| 6,265,739 | B1 * | 7/2001 | Yaegashi et al. ............. 257/296 |
| 6,340,611 | B1 * | 1/2002 | Shimizu et al. ............. 438/201 |

FOREIGN PATENT DOCUMENTS

JP           11-26731           1/1999

* cited by examiner

*Primary Examiner*—Thien F. Tran
(74) *Attorney, Agent, or Firm*—Oblon, Spivak, McClelland, Maier & Neustadt, P.C.

(57) ABSTRACT

A semiconductor memory device includes a semiconductor substrate, an element isolation region formed in the semiconductor substrate and including a thick element isolating insulation film, for isolating an element region, a first gate electrode provided on the element region in the semiconductor substrate in self-alignment with the element isolation region, a second gate electrode provided on the first gate electrode with an insulation film interposed therebetween, and a resistance element formed on the element isolation region, the resistance element and the second gate electrode being formed of the same conductive film.

15 Claims, 5 Drawing Sheets

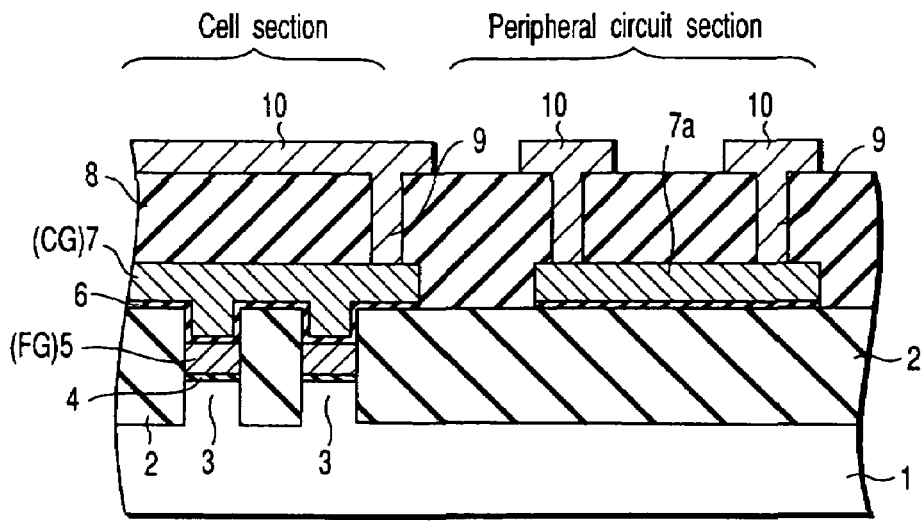
F I G. 1
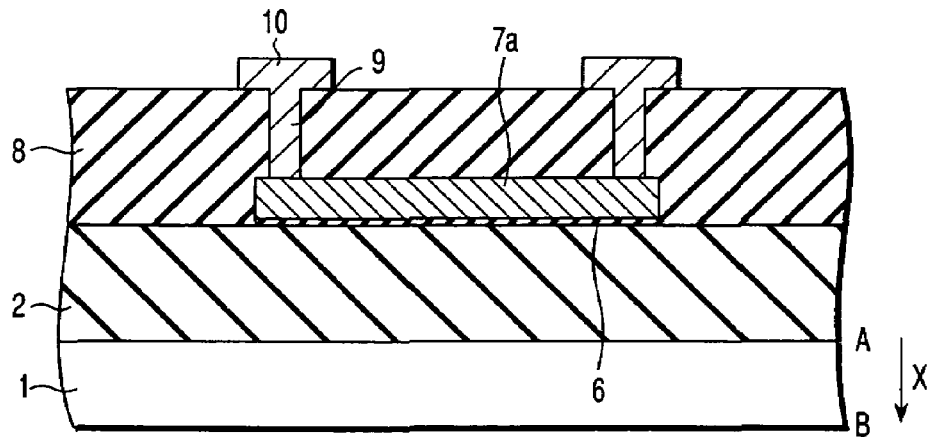
F I G. 3A
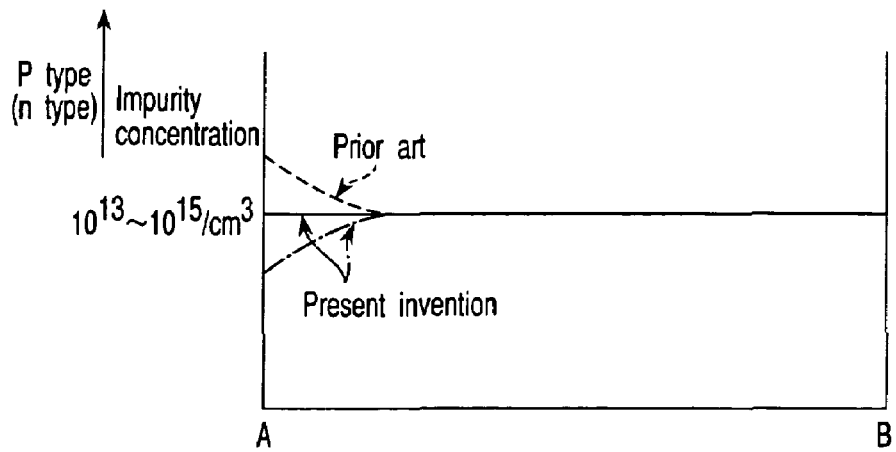
F I G. 3B

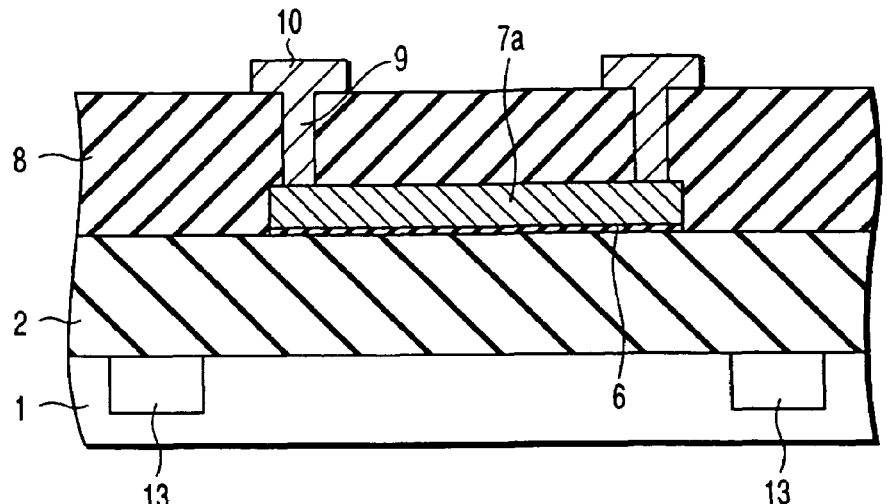
FIG. 4
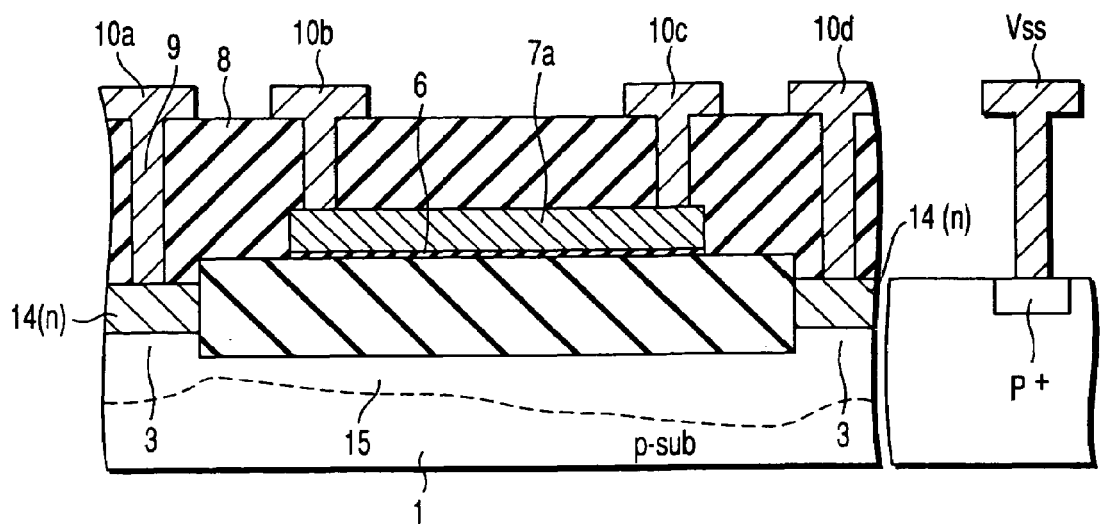
FIG. 5A
| Node | 10a | 10b | 10c | 10d |
|---|---|---|---|---|
| Potential | V(10a)>0<br><br>V(10b)>V(10c) | V(10b)>0 | V(10c)>0<br><br>V(10b)<V(10c) | V(10d)=V(10a) |
FIG. 5B

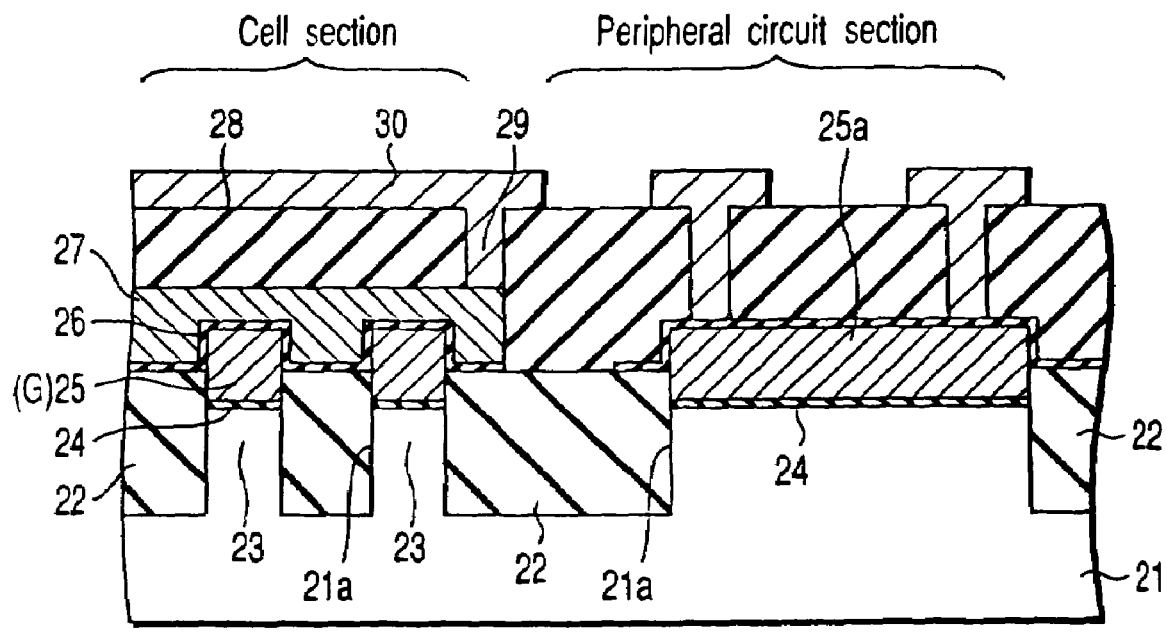
F I G. 9

FLASH MEMORY HAVING MEMORY SECTION AND PERIPHERAL CIRCUIT SECTION

CROSS-REFERENCE TO RELATED APPLICATIONS

This application is a divisional of U.S. application Ser. No. 09/899,155 filed Jul. 6, 2001 now U.S. Pat. No. 6,667,507, and is based upon and claims the benefit of priority from the prior Japanese Patent Application No. 2000-301308, filed Sep. 29, 2000, the entire contents of each of which are incorporated herein by reference.

BACKGROUND OF THE INVENTION

The present invention relates to a semiconductor device and more particularly to the structure of a peripheral circuit section of a nonvolatile semiconductor memory.

A flash memory generally includes various types of delay circuits necessary for operations, a write/erase high-voltage stabilization circuit, and a reference voltage generation circuit as well as memory cells in a chip. The flash memory therefore requires resistance elements constituting these circuits. These resistance elements generally have ohmic characteristics. The resistance elements are formed in almost the same step as that of forming a memory cell in a chip in order to improve the efficiency of a manufacturing process.

Referring to FIGS. 7A and 7B, an operation of the write/erase high-voltage stabilization circuit will be described as one example of a circuit using the above resistance elements. FIG. 7A schematically shows the write/erase high-voltage stabilization circuit, and FIG. 7B shows respective voltages generated when the circuit performs its operations. As shown in FIG. 7A, the write/erase high-voltage stabilization circuit is a feedback circuit for controlling an output voltage of a booster circuit. More specifically, resistance elements R1 and R2 are connected to an output terminal of the booster circuit including a charge pump circuit. The resistance elements R1 and R2 divide the output voltage of the booster circuit to generate a voltage Va. The voltage Va is compared with a reference voltage Vref in an operational amplifier OP1 to generate a control signal Φ1. In response to the control signal Φ1, the booster circuit is operated to control its output voltage.

If the voltage Va becomes lower than the reference voltage Vref as shown in FIG. 7B, the booster circuit in FIG. 7A operates. If the voltage Va becomes higher than the reference voltage Vref, the booster circuit stops its boost operation and a feedback operation is performed to increase the potential. The output voltage is thus held at a required voltage Vpp.

If, however, the capacitance between the resistance elements R1 and R2 and the nodes of the other elements in a semiconductor substrate is large, a delay due to the CR time constant increases. Then, the feedback operation is delayed and the output voltage greatly deviates from the required voltage Vpp. This hinders the flash memory from performing stable and high-speed operation. The smaller the capacity between the resistance elements and the nodes of the other elements, the higher the precision of the voltage stabilization circuit.

FIG. 8 is a schematic cross-sectional view of a prior art flash memory. In this flash memory, an element isolation region 22 is formed in a silicon substrate 21 and a gate oxide film 24 is formed in an element region 23 of the cell section. After that, a first gate electrode 25 is deposited. The first gate electrode 25 is used as a floating gate in the cell section and a resistance element 25a in the peripheral circuit section. In FIG. 8, reference numeral 26 indicates a first insulation film, 27 shows a second gate electrode, 28 denotes an interlayer insulation film, and 30 represents a wiring layer.

In the cell section, the first gate electrode can be formed of two layers. In the peripheral circuit section, the resistance element 25a can be formed of gate materials of the upper one of the two layers.

Since the resistance element 25a is formed on the thick element isolation region 22, the capacitance between the resistance element 25a and the nodes of the other elements in the semiconductor substrate can be decreased.

In the flash memory so constituted, the first gate electrode 25 is formed after forming the element isolation region 22. As shown in FIG. 8, therefore, the first gate electrode 25 extends to the element isolation region 22. Consequently, the element isolation region 22 of the cell section cannot be decreased in size and the elements are difficult to miniaturize further.

BRIEF SUMMARY OF THE INVENTION

The present invention has been developed to resolve the above problem and an object thereof is to provide a semiconductor memory device capable of reducing the capacitance between a resistance element and a substrate in a peripheral circuit section even when a first gate electrode is isolated in self-alignment.

The object of the invention is attained by the following constituting elements:

A semiconductor memory device according to a first aspect of the present invention comprises a semiconductor substrate, an element isolation region provided in the semiconductor substrate and including a thick element isolating insulation film, for isolating an element region, a first gate electrode provided on the element region in the semiconductor substrate in self-alignment with the element isolation region, a second gate electrode provided on the first gate electrode with an insulation film interposed therebetween, and a resistance element provided on the element isolation region, the resistance element and the second gate electrode being formed of a same conductive film.

A semiconductor memory device according to a second aspect of the present invention comprises a semiconductor substrate, an element isolation region provided in the semiconductor substrate and including a thick element isolating insulation film, for isolating an element region, and a resistance element provided on the element isolation region and formed of a conductive film, wherein the semiconductor substrate has impurity concentration profile which is set to be constant or be lower in accordance with the depth of the semiconductor substrate getting shallower toward the region corresponding to the resistance element.

A semiconductor memory device according to a third aspect of the present invention comprises a semiconductor substrate of a first conductivity type, an element isolation region provided in the semiconductor substrate, for isolating an element region, a resistance element provided on the element isolation region and formed of a conductive film, and an opposite-conductivity-type diffusion layer of a second conductivity type that is opposite to the first conductivity type of the semiconductor substrate, the opposite-conductivity-type diffusion layer being formed in the element region adjacent to the element isolation region on which the resistance element is provided.

A method of manufacturing a semiconductor memory device according to a fourth aspect of the present invention comprises the steps of forming a gate oxide film and a first conductive film on a memory cell array region and a peripheral circuit region of a semiconductor substrate, forming a mask material on the first conductive film where the cell transistor is to be formed in the memory cell array region, forming trenches by etching the first conductive film and the gate oxide film with the mask material, forming an insulation film in the trenches in the memory cell array region and the peripheral circuit region, removing the mask material, forming a first insulation film on at least the first conductive film, forming a second conductive film on the first insulation film in the memory cell array region and the peripheral circuit region, and forming the resistance element by etching the second conductive film on the peripheral region.

In the semiconductor memory device of the present invention described above, the capacitance between the resistance element and the substrate in the peripheral circuit section can be reduced even when the first gate electrode is isolated in self-alignment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 1 is a cross-sectional view of a flash memory according to a first embodiment of the present invention;

FIG. 3A is a cross-sectional view of a flash memory according to a second embodiment of the present invention;

FIG. 3B is a diagram showing a relationship between the depth of a silicon (Si) substrate and the concentration of impurities in the flash memory according to the second embodiment of the present invention;

FIG. 4 is a cross-sectional view of a flash memory according to a third embodiment of the present invention;

FIG. 5A is a cross-sectional view of a flash memory according to a fourth embodiment of the present invention;

FIG. 5B is a table showing a potential applied to each of nodes in the flash memory according to the fourth embodiment of the present invention;

FIG. 9 is a cross-sectional view of an embodiment of a flash memory for miniaturizing where a first gate electrode is used as a resistance element.

DETAILED DESCRIPTION OF THE INVENTION

Figure 8:
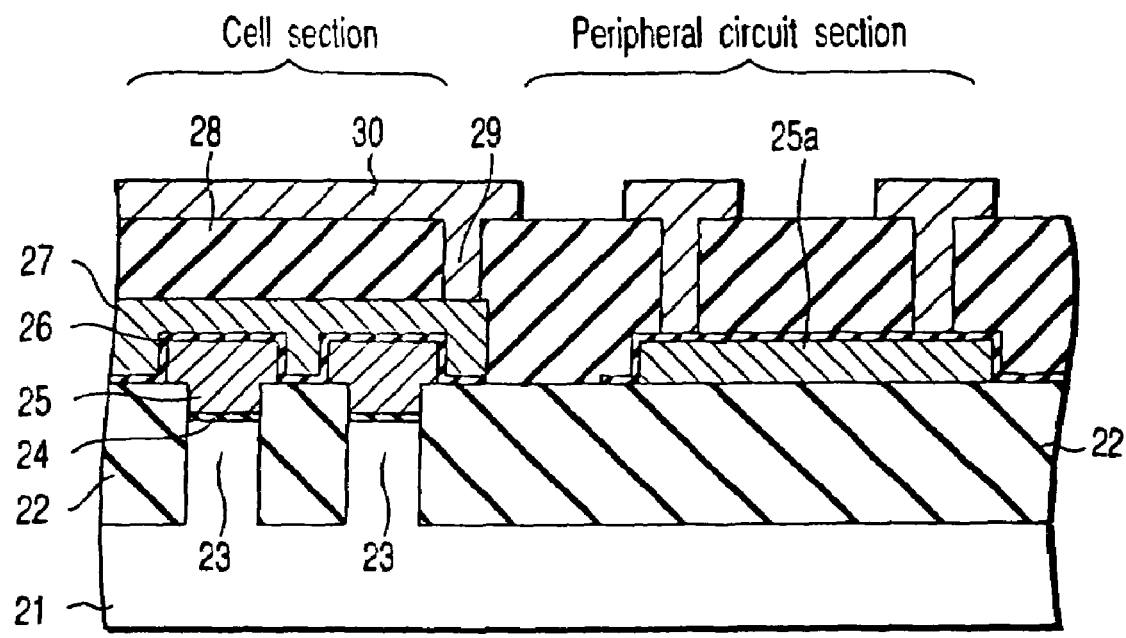
FIG. 8 is a cross-sectional view of a prior art flash memory.

In the process of development of the present invention, the present inventors studied to miniaturize the elements further in the flash memory shown in FIG. 8. The inventors made improvements to the flash memory as described below and obtained findings thereabout.

FIG. 9 is a cross-sectional view of an improvement of the flash memory shown in FIG. 8. In FIG. 9, the same constituent elements as those of FIG. 8 are indicated by the same reference numerals. As FIG. 9 shows, a gate oxide film 24 is formed on the entire surface of a substrate 21 to a thickness of several tens of angstroms (Å) to about 500 angstroms (Å). Then, a first gate electrode material 25 is deposited on the gate oxide film 24. The first gate electrode material 25, gate oxide film 24 and substrate 21 are etched to form a trench 21a. The trench 21a is filled with an insulation film to form an element isolation region 22. The element isolation region 22 is isolated from a first gate electrode G in self-alignment. In the peripheral circuit section, the first gate electrode material 25 on the gate oxide film 24 is used as a resistance element 25a. In this structure, the element isolation region 22 can be decreased in size; accordingly, the memory cells can be miniaturized further.

In the peripheral circuit section, however, the resistance element 25a is provided on the gate oxide film 24 having a thickness of several tens of angstroms (Å) to about 500 angstroms (Å). Consequently, the capacitance between the resistance element 25a and the substrate 21 increases.

If the above capacitance increases, a feedback operation of a high-voltage stabilization circuit is delayed to make it difficult to generate a stable voltage.

Embodiments of the present invention made based on the above findings will now be described with reference to the accompanying drawings. Hereinafter the constituent elements having substantially the same functions and structures are indicated by the same reference numerals. Repetitive descriptions of these elements will be given only when the need arises.

A flash memory according to a first embodiment of the present invention will be described with reference to FIG. 1. FIG. 1 is a schematic cross-sectional view of the flash memory. In the cell section of the flash memory shown in FIG. 1, a gate oxide film 4 and a first gate electrode 5 are formed in an element region 3 isolated by an element isolation region 2 in a semiconductor substrate 1. In other words, the first gate electrode 5 is not formed on the element isolation region 2. The electrode 5 serves as a floating gate (FG).

A second gate electrode material 7 is formed on a first insulation film 6. The material 7 functions as a control gate (CG: word line) of a cell transistor.

In the peripheral circuit section, a resistance element 7a constituted of the second gate electrode material 7 is provided on the element isolation region 2 with the first insulation film interposed therebetween.

In FIG. 1, reference numeral 8 indicates a second insulation film, 9 shows a contact, and 10 denotes a wiring layer.

In the peripheral circuit section with the above structure, the resistance element 7a is formed on the element isolation region 2 with the first insulation film 6 interposed therebetween. The capacitance between the resistance element 7a and the semiconductor substrate 1 can thus be decreased. For this reason, a CR delay is decreased and thus the high-voltage stabilization circuit using the resistance element 7a can be operated with stability and high reliability.

A method of manufacturing a flash memory with the above structure will now be described with reference to FIGS. 2A to 2D.

Figure 2A:
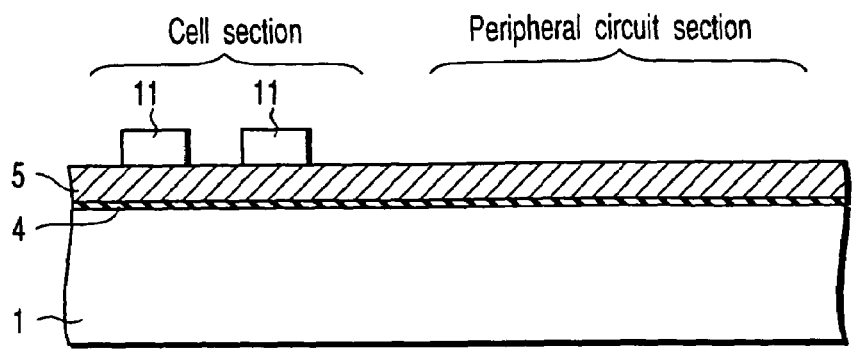
FIGS. 2A to 2D are cross-sectional views of manufacturing steps of the flash memory according to the first embodiment of the present invention.

In FIG. 2A, reference numeral 1 indicates a semiconductor substrate, 4 shows a gate oxide film formed of silicon oxide, silicon nitride, or the like, and 5 denotes a first gate electrode material formed of polysilicon, amorphous silicon, or the like. The gate oxide film 4 is formed on the entire surface of the semiconductor substrate 1 and then the first gate electrode material 5 is formed on the film 4. An insulating mask material 11 is formed on the first gate electrode material 5. Using the mask material 11 as a mask, the first gate electrode 5, gate oxide film 4 and substrate 1 are etched in self-alignment to form a trench 12 as illustrated in FIG. 2B.

Figure 2B:
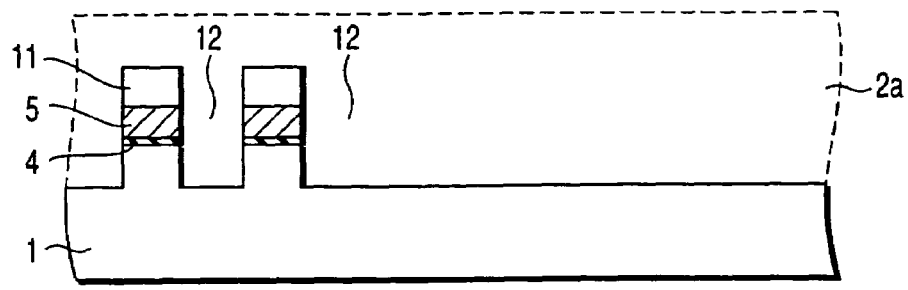
Figure 2C:
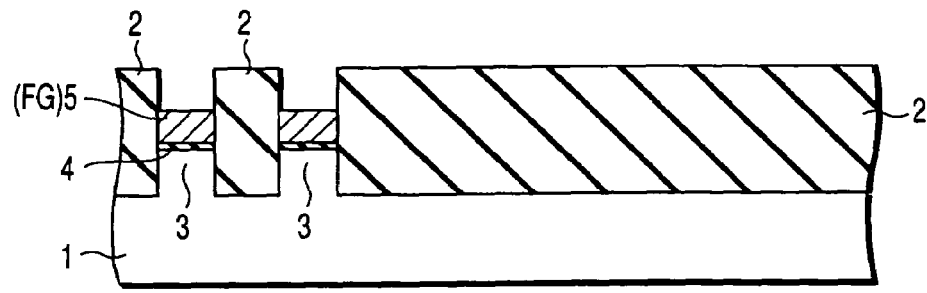

As FIG. 2B shows, an insulation film 2a is deposited on the entire surface of the resultant structure and polished by CMP (chemical mechanical polishing) using the mask material 11 as a stopper. The insulation film 2a is therefore removed to the surface of the mask material 11 and the trench 12 is filled with the insulation film 2a. After that, the mask material 11 is eliminated to form an element isolation region 2 as shown in FIG. 2C. Thus, a floating gate (FG) is formed of the first gate electrode material 5 in self-alignment with the element isolation region 2.

Figure 2D:
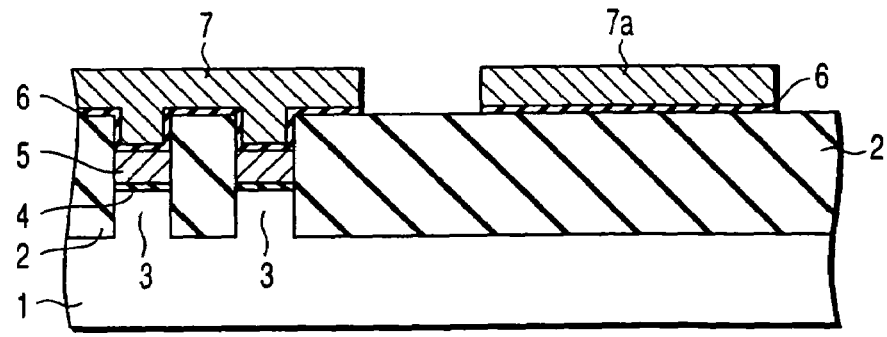

A first insulation film 6 and a second gate electrode material 7 are deposited in sequence on the entire surface of the resultant structure. As FIG. 2D shows, the film 6 and the material 7 are partly etched. In the cell section, a word line serving as a control gate (CG) is formed of the second gate electrode material 7. In the peripheral circuit section, a resistance element 7a is formed thereof. After that, a second insulation film 8 is deposited on the entire surface of the resultant structure and a contact hole 9 is formed in the film 8, as illustrated in FIG. 1. In the peripheral circuit section, the contact hole 9 is formed in a given portion of the resistance element 7a to obtain a required resistance value. Then, a metal film is formed on the entire surface of the second insulation film 8, thus the contact hole 9 is filled therewith. After that, the metal film is etched to form a wiring layer 10.

Since, in the above first embodiment, the floating gate FG is formed in self-alignment with the element isolation region 2 in the cell section, the cells can be decreased in size. In the peripheral circuit section, the resistance element 7a is formed on the element isolation region 2 with the first insulation film 6 interposed therebetween. The element isolation region 2 and the first insulation film 6 are interposed between the resistance element 7a and the substrate 1 and thus the capacitance between the element 7a and the substrate 1 can be reduced. By applying the resistance element 7a to a high-voltage stabilization circuit or the like, the circuit can produce a boosted voltage with stability and high reliability.

In the foregoing first embodiment, the resistance element 7a of the peripheral circuit section is formed out of the second gate electrode material 7. The present invention is not limited to this. For example, the resistance element can be formed of wiring other than the word line formed above the second gate electrode material 7. This wiring is formed of polysilicon whose sheet resistance is 100 Ω or higher. This structure allows the capacitance between the substrate 1 and the resistance element 7a to be decreased further.

FIGS. 3A and 3B illustrate a flash memory according to a second embodiment of the present invention. FIG. 3A is a schematic cross-sectional view of a peripheral circuit section of the flash memory. The structure of the flash memory is almost the same as that of the flash memory according to the first embodiment.

In the second embodiment, neither P-type nor N-type impurities are implanted into the surface of a semiconductor substrate 1 located under the resistance element 7a to make the impurity concentration of the substrate the same as that of bulk. Alternatively, if the conductivity type of the substrate 1 is a P type, its opposite type, i.e., N-type impurities are implanted into the surface of the substrate.

Normally a P-type or N-type well is formed in a semiconductor substrate and cell and part of peripheral circuit sections are formed in the well. The impurity concentration of the substrate 1 increases toward the surface of the substrate or as the depth X of the substrate becomes smaller, as indicated by the broken line in FIG. 3B. According to the second embodiment, the impurity concentration of the semiconductor substrate 1 is set at the same as that of bulk and thus it can be made constant as indicated by the solid line in FIG. 3B. If, moreover, impurities of a conductivity type opposite to that of impurities of the substrate 1 are implanted, the impurity concentration of the surface of the substrate 1 can be lowered, as indicated by alternate long and short dashed lines in FIG. 3B. When the impurity concentration of the substrate 1 is high, the capacitance between the substrate 1 and the resistance element 7a increases; however, it can be reduced by setting the impurity concentration of the substrate 1 low as in the second embodiment. Consequently, the high-voltage stabilization circuit with the resistance element can produce a boosted voltage with high precision and stability.

FIG. 4 illustrates a flash memory according to a third embodiment of the present invention. Assume in the second embodiment that the semiconductor substrate 1 is a P type, the insulation film 8 formed thereon is charged positively, and the impurity concentration of the substrate 1 is low. Electrons may thus be collected on the surface of the substrate 1 and inverted. If a high voltage is applied to the resistance element 7a in this state, the inverted electrons are collected from the surface of the substrate 1 onto the inner portion thereof right under the resistance element 7a. The variation of voltage in the inversion layer follows that of voltage of the resistance element 7a with time. The capacitance between the resistance element 7a and the semiconductor substrate 1 increases accordingly.

In the third embodiment, as shown in FIG. 4, for example, high-concentration p-type impurities are implanted into the P-type semiconductor substrate 1, surrounding the resistance element 7a. Thus, a high-concentration region 13 is formed in the substrate 1. Even though a high voltage is applied to the resistance element 7a to generate electrons from the surface of the substrate 1, the electrons can be prevented from concentrating on that portion of the surface of the substrate 1 which is located under the resistance element 7a. It is thus possible to prevent the surface of the substrate 1 under the resistance element 7a from being inverted. Consequently, the capacitance between the resistance element 7a and the semiconductor substrate 1 can be prevented from increasing, with the result that the high-voltage stabilization circuit using the resistance element 7a can generate a boosted voltage with high precision and stability.

FIG. 5A schematically shows a flash memory according to a fourth embodiment of the present invention. Referring to FIG. 5A, in order to reduce the capacitance between the resistance element 7a and the substrate 1, an element region adjacent to the resistance element 7a is formed as an opposite-conductivity-type region 14 whose conductivity type is opposite to that of the substrate 1. A contact is formed in this region 14 such that a potential can be applied to the resistance element 7a and the substrate 1 independently.

The following is a case where the semiconductor substrate 1 is a P type and the opposite conductivity-type region 14 is an N type. Even though the substrate 1 is an N type, the same operations can be performed by inverting the conductivity type and the potential.

The resistance element 7a included in the voltage stabilization circuit operates to stably apply a specific potential when data is read, written or erased in accordance with the operation of the flash memory. In this time, a positive potential is applied to the resistance element 7a, and the semiconductor substrate 1 is set at a ground potential Vss, as illustrated in FIG. 5B. Simultaneously, a positive potential is applied to the opposite-conductivity-type region 14. During the time period other than the above, the resistance element 7a and the opposite-conductivity-type region 14 are set at the ground potential Vss or a low positive potential.

When a positive potential is applied to the resistance element 7a, an inversion layer is formed in the semiconductor substrate 1 during the period the resistance element 7a is operated. The capacitance between the element 7a and the substrate 1 increases accordingly. The positive potential applied to the opposite-conductivity-type region 14 is thus controlled optimally such that a depletion layer 15 formed under the resistance element 7a can be connected to that formed around the region 14. Therefore, the minority carrier electrons generated from the substrate 1 under the element 7a can be absorbed by the region 14. It is thus possible to prevent an inversion layer from being formed on the semiconductor substrate 1 under the resistance element 7a. In other words, the depletion layer 15 that responds to vibration of potential of the resistance element 7a is formed more deeply than the semiconductor substrate 1 (deep-depletion). Thus, the depletion layer is less varied on the surface of the substrate 1. Consequently, the capacitance between the substrate 1 and the element 7a can be reduced.

The same advantages as those of the first to third embodiments can be obtained from the fourth embodiment.

Figure 6:
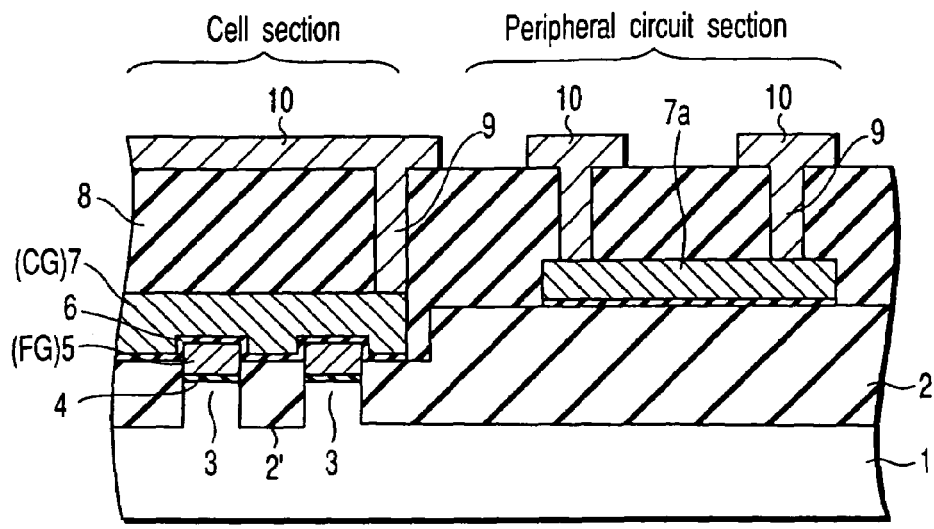
FIG. 6 is a cross-sectional view of a flash memory according to a fifth embodiment of the present invention.
Figure 7A:
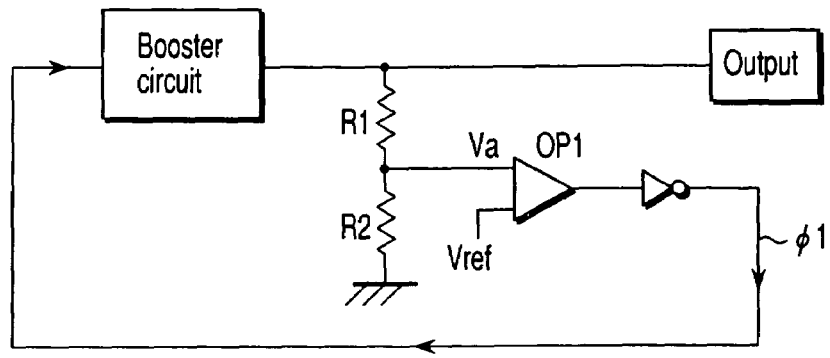
FIG. 7A is a block diagram of a boosted-potential stabilization circuit using resistance elements.
Figure 7B:
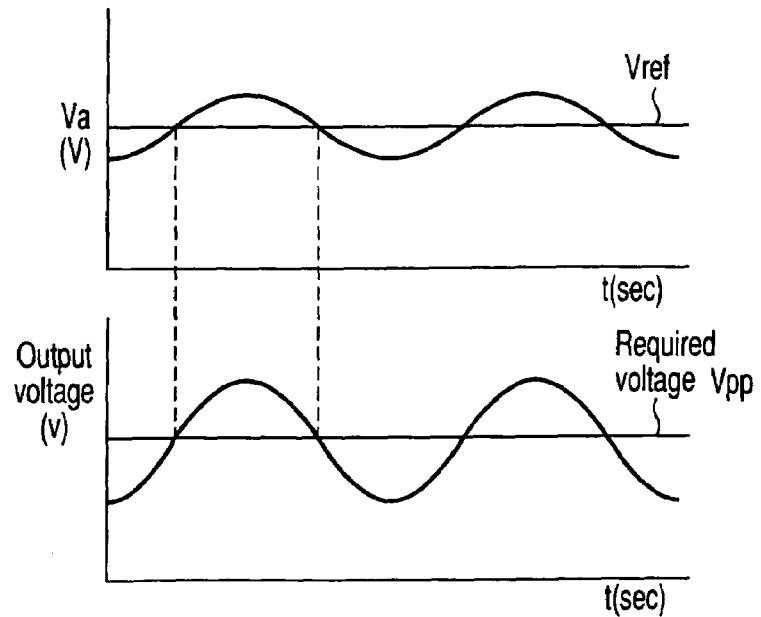
FIG. 7B is a graph of voltage waveforms of the circuit shown in FIG. 7A.

FIG. 6 illustrates a flash memory according to a fifth embodiment of the present invention. The fifth embodiment is a modification to the first embodiment.

In the above embodiments, a method of etching the element isolation region of the cell section to make it lower than the floating gate 5 is considered in order to increase the capacitance between the floating gate 5 and the control gate 7 in the cell section.

In this method, however, the capacitance between the resistance element 7a and the substrate will increase if the element isolation region in the peripheral circuit section is also etched and made lower.

In the fifth embodiment, therefore, part of the element isolation region 2 on which the resistance element 7a is to be formed is covered when an element isolation region 2' of the cell section is etched, as shown in FIG. 6. The height of the element isolation region 2 in the peripheral circuit section can thus be maintained.

The same advantages as those of the first embodiment can be obtained from the fifth embodiment. If the element isolation region 2' of the cell section is set lower than the floating gate, the capacitance of memory cells can be increased.

In the foregoing first to fifth embodiments, the floating gate has a single-layer structure. The present invention is not limited to this structure. The floating gate can be constituted of two layers and the resistance element can be formed of gate materials of the upper one of the layers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate;
    a first element isolating insulation film and a second isolating insulation film, for isolating an element region;
    a first gate electrode including a first portion having a side surface in contact with a side surface of the first element isolating insulation film and a second portion having a side surface aligned with the side surface of the first portion of the first gate electrode, the second portion projecting from an upper surface of the first element isolating insulation film;
    a second gate electrode including a first portion provided on the first gate electrode with a first insulation film interposed therebetween and a second portion extending on the first element isolating insulation film, the second portion having a thickness different from that of the first portion of the second gate electrode; and
    a resistance element provided on the second element isolating insulation film with a second insulation film interposed therebetween, the resistance element being formed of a same material as that of the second gate electrode and not extending on the element region, the second insulation film being formed of a same material as that of the first insulation film.

2. The device according to claim 1, wherein the second element isolating insulation film has an upper surface higher than that of the first element isolating insulation film.

3. The device according to claim 1, wherein the second portion of the second gate electrode and the resistance element are isolated from each other on the second element isolating insulating film.

4. The device according to claim 1, wherein the first gate electrode is a floating gate of a non-volatile semiconductor memory, and the second gate electrode is a control gate electrode.

5. The device according to claim 1, wherein the resistance element is part of a peripheral control circuit provided on a periphery of a memory cell array region.

6. A semiconductor memory device comprising:
    a semiconductor substrate;
    a first element isolating insulation film and a second isolating insulation film, for isolating an element region, the second element isolating insulation film having a part having a same height as that of the first element isolating insulation film, and the second element isolating insulation film having an upper surface higher than that of the first element isolating insulation film;
    a first gate electrode including a first portion having a side surface in contact with a side surface of the first element isolating insulation film and a second portion having a side surface aligned with the side surface of the first portion of the first gate electrode, the second portion projecting from an upper surface of the first element isolating insulation film;

a second gate electrode including a first portion provided on the first gate electrode with a first insulation film interposed therebetween and a second portion extending on the first element isolating insulation film, the second portion having a thickness different from that of the first portion of the second gate electrode; and a resistance element provided on the second element isolating insulation film, the resistance element being formed of a same material as that of the second gate electrode and not extending on the element region.

7. The device according to claim 6, wherein the second portion of the second gate electrode and the resistance element are isolated from each other on the second element isolating insulation film.

8. The device according to claim 6, wherein the first gate electrode is a floating gate of a non-volatile semiconductor memory, and the second gate electrode is a control gate electrode.

9. The device according to claim 6, wherein the resistance element is part of a peripheral control circuit provided on a periphery of a memory cell array region.

10. A semiconductor memory device having a cell section and a peripheral section comprising:

a semiconductor substrate;

a first element isolating insulation film provided in the cell section;

a second element isolating insulation film provided in the peripheral section;

a first gate electrode including a first portion having a side surface in contact with a side surface of the first element isolating insulation film and a second portion having a side surface aligned with the side surface of the first portion of the first gate electrode, the second portion projecting from an upper surface of the first element isolating insulation film;

a second gate electrode including a first portion provided on the first gate electrode with a first insulation film interposed therebetween and a second portion extending on the first element isolating insulation film, the second portion having a thickness different from that of the first portion of the second gate electrode; and a resistance element provided on the second element isolating insulation film with a second insulation film interposed therebetween, the resistance element being formed of a same material as that of the second gate electrode, the second insulation film being formed of a same material as that of the first insulation film.

11. The device according to claim 10, wherein the second element isolating insulation film has an upper surface higher than that of the first element isolating insulation film.

12. The device according to claim 10, wherein the second portion of the second gate electrode and the resistance element are isolated from each other on the second element isolating insulation film.

13. The device according to claim 10, wherein the first gate electrode is a floating gate of a non-volatile semiconductor memory, and the second gate electrode is a control gate electrode.

14. The device according to claim 10, wherein the resistance element is part of a peripheral control circuit provided on a periphery of a memory cell array region.

15. The device according to claim 10, wherein the second element isolating insulation film has a part having a same height as that of the first element isolating insulation film.

* * * * *